(12) United States Patent
Higuchi (10) Patent No.: US 8,711,892 B2
(45) Date of Patent: Apr. 29, 2014

(54) NITRIDE SEMICONDUCTOR LASER DEVICE

(75) Inventor: Yu Higuchi, Anan (JP)

(73) Assignee: Nichia Corporation, Anan-shi (JP)

( * ) Notice: Subject to any disclaimer, the term of this patent is extended or adjusted under 35 U.S.C. 154(b) by 446 days.

(21) Appl. No.: 12/975,168

(22) Filed: Dec. 21, 2010

(65) Prior Publication Data

US 2011/0150023 A1 Jun. 23, 2011

(30) Foreign Application Priority Data

Dec. 22, 2009 (JP) .................................. 2009-289938
Nov. 17, 2010 (JP) .................................. 2010-256370

(51) Int. Cl.
*H01S 5/00* (2006.01)

(52) U.S. Cl.
USPC ..................................................... 372/46.015

(58) Field of Classification Search
USPC ............... 257/98, E21.158; 438/46; 372/50.1
See application file for complete search history.

(56) References Cited

U.S. PATENT DOCUMENTS

2010/0098127 A1* 4/2010 Higuchi et al. ............ 372/50.11

FOREIGN PATENT DOCUMENTS

JP 2009-054855 3/2009

OTHER PUBLICATIONS

Yu Higuchi et al. "Room-Temperature CW Lasing of a GaN-Based VCSEL by current Injection", Applied Physics Express 1 (2008). p. 121102-1 to 121102-3.*
Higuchi et al. Room-Temperature CW Lasing of a GaN-based Vertical-Cavity Surface-Emitting Laser by Current Injection, The Japan Society of Applied Physics, (2008) 12110—Dec. 5, 2008.*

* cited by examiner

*Primary Examiner* — Jessica Stultz
*Assistant Examiner* — Tuan Nguyen
(74) *Attorney, Agent, or Firm* — Foley & Lardner LLP (57) ABSTRACT

A nitride semiconductor laser device includes: a stack, the stack including an n-type layer and a p-type layer each including a nitride semiconductor; an n-electrode electrically coupled to the n-type layer; a p-electrode electrically coupled to the p-type layer; and a thermally conductive portion disposed in contact with the p-type layer in a region which is different from the region where the p-electrode is connected, wherein the thermally conductive portion is electrically insulated from the p-electrode. Manufacturing steps specific to nitride semiconductors are employed to form the device. An optical apparatus, such as an optical disc device, a display device, or a lighting device includes such a nitride laser device and depends its functions thereto.

29 Claims, 6 Drawing Sheets

Prior Art

FIG. 5

NITRIDE SEMICONDUCTOR LASER DEVICE

CROSS-REFERENCE TO RELATED PATENT APPLICATIONS

The present application claims priority to Japan Patent Application Nos. 2009-289938 filed Dec. 22, 2009, and 2010-256370 filed Nov. 17, 2010, both of which are incorporated herein by reference in their entireties.

BACKGROUND

1. Technical Field

The present disclosure relates to semiconductor laser devices, particularly nitride semiconductor laser devices.

2. Description of the Related Art

Figure 5:
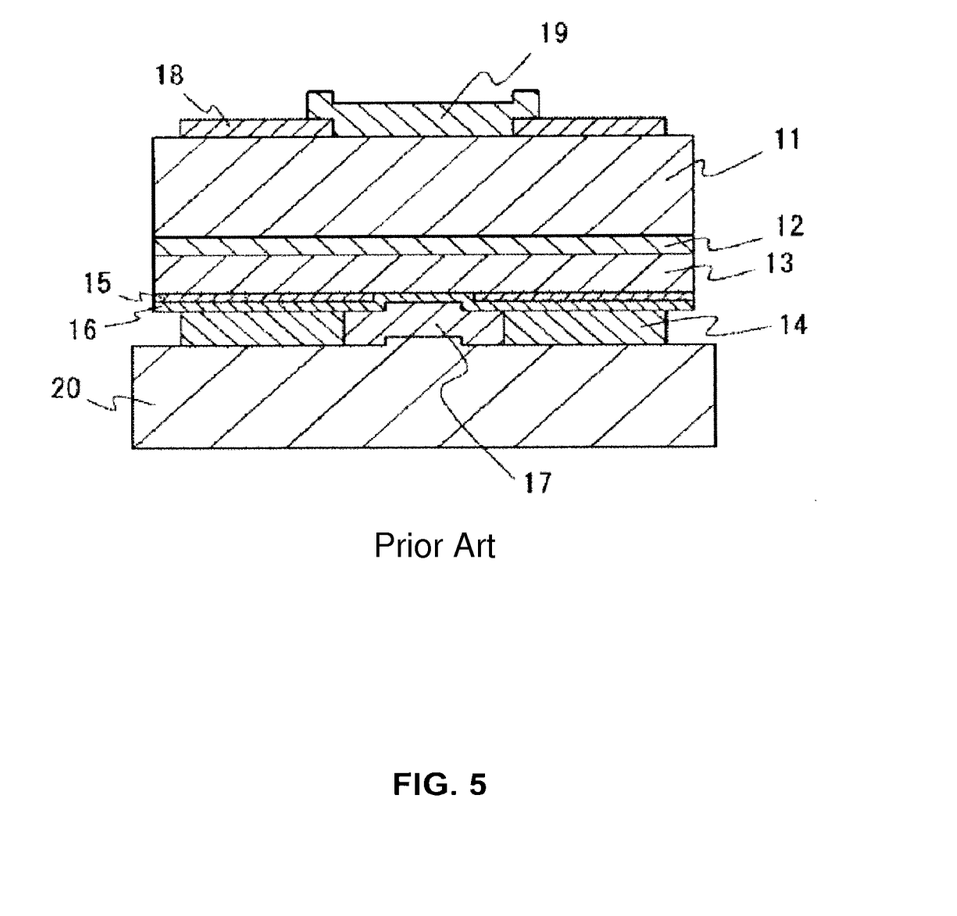
FIG. 5 is a schematic cross sectional view illustrating a conventional nitride semiconductor laser device.

As an example of a conventional nitride semiconductor laser device, a nitride semiconductor laser device described in Applied Physics Express 1 (2008) 121102 is illustrated in FIG. 5.

The illustrated nitride semiconductor laser device has an n-type layer 11 on which an n-electrode 18 is disposed, an active layer 12, and a p-type layer 13.

An insulating portion 15 defining an opening is formed in contact with the p-type layer 13.

Further, at the opening, an optically transmissive p-electrode 16 is formed on the surface of the p-type layer and a reflector 17 made of dielectric materials is formed on the other surface of the p-electrode 16.

The p-electrode 16 has an extended portion extending over the surface of the p-type layer 13 interposing the insulating portion 15, and is electrically connected to a connecting electrode 14 at the extended portion.

The connecting electrode 14 is electrically connected to a conductive support substrate 20.

SUMMARY

In one aspect, a nitride semiconductor laser device is provided. The device includes: a stack, the stack including an n-type layer and a p-type layer each including a nitride semiconductor; an n-electrode electrically coupled to the n-type layer; a p-electrode electrically coupled to the p-type layer; and a thermally conductive portion disposed in contact with the p-type layer in a region which is different from the region where the p-electrode is connected, wherein the thermally conductive portion is electrically insulated from the p-electrode.

In one embodiment, the thermally conductive portion surrounds a region of the p-type layer to which the p-electrode is connected.

At least a part of the thermally conductive portion can be buried in the p-type layer. In one embodiment, the thermally conductive portion forms a plurality of protrusions in the p-type layer.

In one embodiment, the n-electrode and the p-electrode are disposed at opposite sides of the stack, and the p-electrode is electrically and thermally connected to a support substrate.

A p-side reflector including dielectric materials can be disposed to the p-electrode at a portion where the p-type layer and the p-electrode are connected and at the side distal from the p-type layer.

In one embodiment, the thermally-conductive portion includes at least one of a Ag/Ni stack, a Cu/TaN stack, a Cu/TiN stack, an Al/TiN stack, a Cu/Ti stack, an Al/Ti stack, or an AlN layer.

In another aspect, a method of manufacturing a semiconductor laser device is provided. The method includes: forming a stack including an n-type layer and a p-type layer each comprising a nitride semiconductor; forming a thermally conductive portion in contact with the p-type layer; and forming a p-electrode electrically coupled to the p-type layer in a region which is different from the region where the thermally conductive portion is connected, forming an n-electrode electrically coupled to the n-type layer; and wherein the thermally conductive portion is electrically insulated from the p-electrode.

In one embodiment, the forming a thermally conductive portion comprises forming the thermally conductive portion to surround a region of the p-type layer which region is for connecting the p-type electrode.

In one embodiment, at least a part of the thermally conductive portion is buried in the p-type layer. The thermally conductive portion can form a plurality of protrusions in the p-type layer.

In another aspect, an optical apparatus is provided including a nitride semiconductor laser device. The nitride semiconductor laser device includes: a stack including an n-type layer and a p-type layer each comprising a nitride semiconductor; an n-electrode electrically coupled to the n-type layer; a p-electrode electrically coupled to the p-type layer; and a thermally conductive portion disposed in contact with the p-type layer in a region which is different from the region where the p-electrode is connected, wherein the thermally conductive portion is electrically insulated from the p-electrode.

In one embodiment, the thermally conductive portion surrounds a region of the p-type layer to which the p-electrode is connected.

In one embodiment, at least a part of the thermally conductive portion is buried in the p-type layer. The thermally conductive portion can form a plurality of protrusions in the p-type layer.

In one embodiment, the n-electrode and the p-electrode are disposed at opposite sides of the stack, and the p-electrode is electrically and thermally connected to a support substrate.

In one embodiment, a p-side reflector comprising dielectric materials is disposed to the p-electrode at a portion where the p-type layer and the p-electrode are connected and at the side distal from the p-type layer.

In one embodiment, the thermally-conductive portion comprises at least one of a Ag/Ni stack, a Cu/TaN stack, a Cu/TiN stack, an Al/TiN stack, a Cu/Ti stack, an Al/Ti stack, or an AlN layer.

In another aspect, a nitride semiconductor laser device is provided. The device includes: a stack including an n-type layer and a p-type layer each comprising a nitride semiconductor; an n-electrode electrically coupled to the n-type layer; a p-electrode electrically coupled to the p-type layer; and a thermally conductive portion disposed in contact with at least one of the p-type layer or the n-type layer in a region which is different from the region where the p-electrode or the n-electrode is connected, wherein the thermally conductive portion is electrically insulated from the p-electrode or the n-electrode.

DETAILED DESCRIPTION

The inventor has recognized that in the conventional nitride semiconductor laser device such as that illustrated in FIG. 5, the insulating portion 15 and the p-electrode 16 (extended portion) are interposed between the p-type layer 13 and the connecting electrode 14. As a result, heat generated in the p-type layer 13 cannot be directly released to the connecting electrode 14.

Further, there has been a problem that the connecting electrode 14 itself reaches a high temperature or is subjected to pressure caused by, for example, applying electric current to the connecting electrode 14 and results in diffusion of members such as a metal in the connecting electrode 14.

If diffusion of metal occurs in the connecting electrode 14, for example, an Ohmic contact with the p-electrode 16 cannot be maintained. To prevent such diffusion from occurring, a barrier layer or the like is required in the connecting electrode 14.

That is, there is a limit to the material and structure of the connecting electrode 14. Thus, the connecting electrode 14 cannot always be made with excellent heat releasing property.

An object of a representative embodiment disclosed herein is therefore to improve the heat releasing property of a nitride semiconductor laser device, and to improve various properties such as threshold current and light output of the device.

The nitride semiconductor laser device has a semiconductor stacked layer portion including an n-type layer and a p-type layer respectively comprising a nitride semiconductor, an n-electrode connected to the n-type layer, and a p-electrode connected to the p-type layer.

A thermally conductive portion is disposed in contact with the p-type layer in a region which is different from the region where the p-electrode is connected, and the thermally conductive portion is electrically insulated from the p-electrode.

In one embodiment, the thermally conductive portion is disposed to surround the region of the p-type layer where the p-electrode is connected.

At least a part of the thermally conductive portion may be buried in the p-type layer.

The n-electrode and the p-electrode can be disposed at opposite sides of the semiconductor stacked layer portion, and the p-electrode is electrically and thermally connected to the support substrate.

At the location where the p-type layer and the p-electrode are connected, a p-side reflector comprising dielectric materials may be disposed to the p-electrode at the side further from the p-type layer.

Representative embodiments will be described below with reference to the drawings.

The embodiments described below are intended to be examples, and are not limiting in scope.

First Example Embodiment

Figure 1:
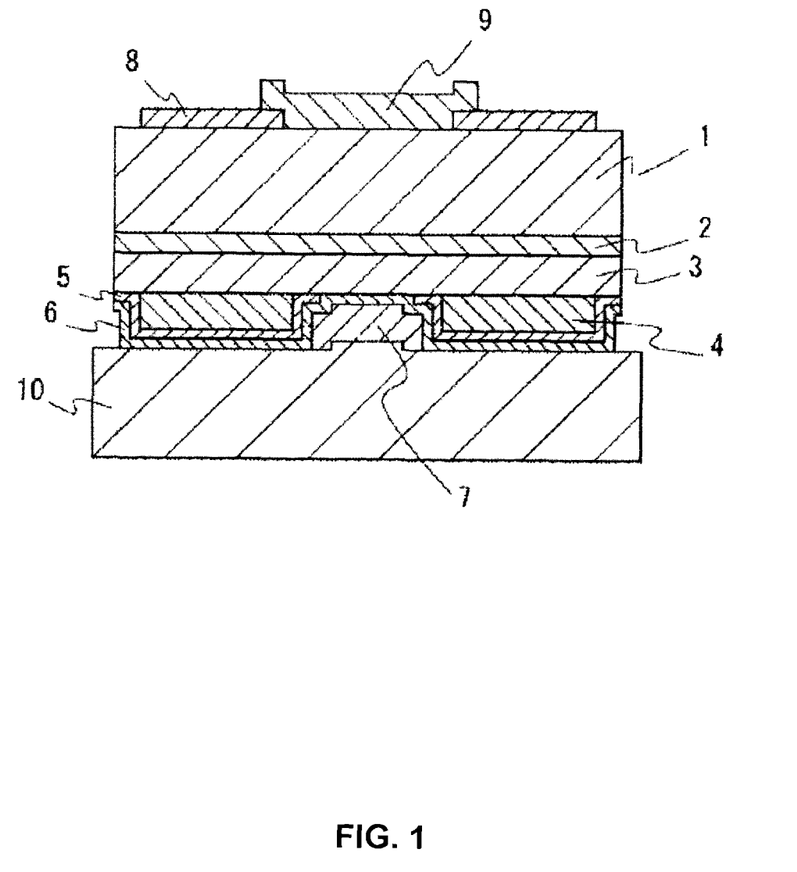
FIG. 1 is a schematic cross-sectional view illustrating a nitride semiconductor laser device according to one embodiment.

FIG. 1 shows a schematic cross sectional view illustrating the structure of a nitride semiconductor laser device according to the first embodiment.

This nitride semiconductor laser device has a semiconductor stacked layer portion including an n-type layer 1 and a p-type layer 3 respectively comprising a nitride semiconductor.

An n-electrode 8 is connected to the n-type layer 1, and a p-electrode 6 is connected to the p-type layer 3.

A thermally conductive portion 4 is disposed in contact with the p-type layer 3 in a region which is different from the region where the p-electrode 6 is electrically connected. The thermally conductive portion 4 is electrically insulated from the p-electrode 6.

With this arrangement, heat generated in the p-type layer 3 can be directly released to the thermally conductive portion 4, so that advantageous effects such as a reduction in the threshold current and improvement in output power can be achieved.

That is, the resistance of the p-type layer is generally substantially larger than the resistance of the n-type layer in a nitride semiconductor, so that heat generation in the p-type layer is substantially greater than heat generation in the n-type layer.

In a laser device, in particular, the current is needed to be concentrated in the laser oscillation region, therefore, heat generation in the p-type layer is substantially greater than that in an LED.

Thus, heat releasing property of high-heat-generating nitride semiconductor laser device can be improved by directly disposing the thermally conductive portion 4 on the p-type layer of the nitride semiconductor laser device, and thus the performance of the nitride semiconductor laser device as a whole can be improved.

Specifically, in the nitride semiconductor laser device of the first embodiment, the thermally conductive portion 4 is electrically insulated from the electrode 6, so that the material of the thermally conductive portion 4 can be selected from a relatively wide range of materials having high thermal conductivity.

That is, there is a problem in a conventional nitride semiconductor laser device such as shown in FIG. 5 that, the connecting electrode 14 itself reaches a high temperature or is subjected to pressure caused by, for example, applying electric current to the connecting electrode 14, which results in diffusion of members such as a metal in the connecting electrode 14.

However, according to the first embodiment, there is no need to supply the current to the thermally conductive portion 4. Therefore, the material having high thermal conductivity can be selected from a relatively wide range of materials with a simple structure.

Figure 2:
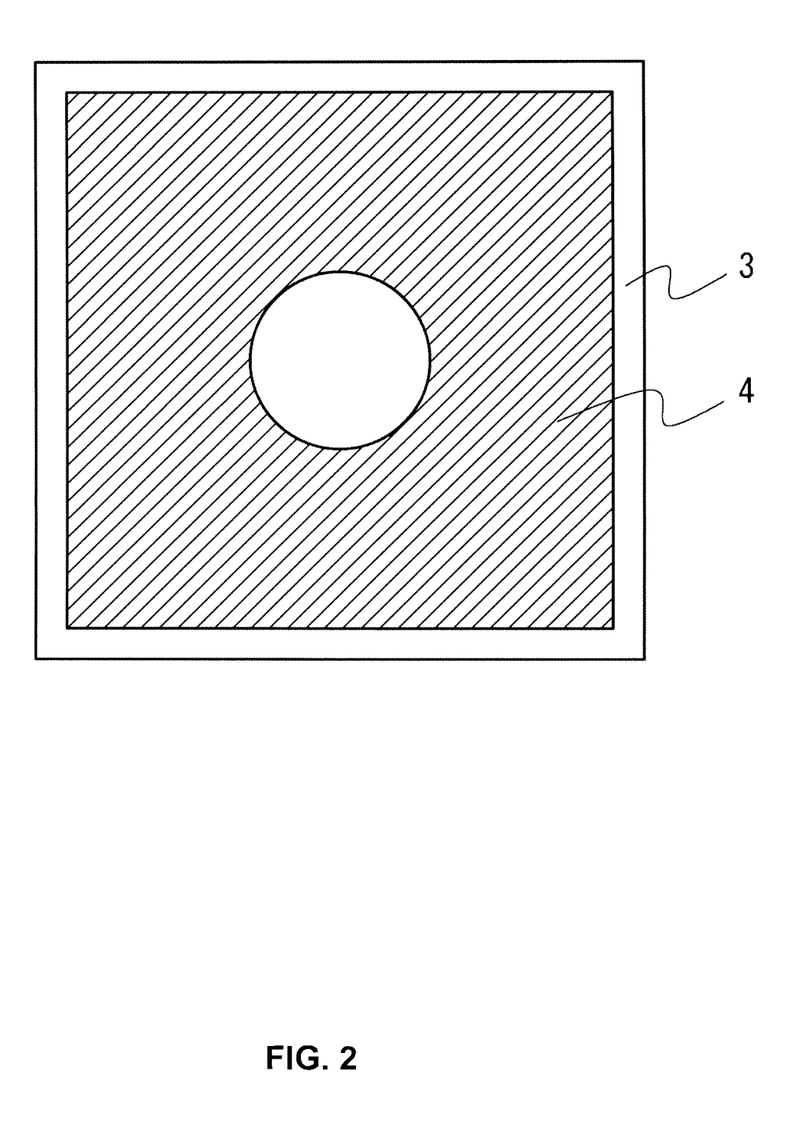
FIG. 2 is a schematic view illustrating a shape of the thermally conductive portion of the nitride semiconductor laser device shown in FIG. 1.

FIG. 2 is a schematic plan view illustrating a shape of the thermally conductive portion 4 of the nitride semiconductor laser device shown in FIG. 1, and shows a relationship between the p-type layer 3 and the thermally conductive portion 4. (For the sake of simplicity, components other than the p-type layer 3 and the thermally conductive portion 4 are not shown in this figure. The shaded portion in the figure corresponds to the forming region of the thermally conductive portion 4.) As shown in FIG. 2, the thermally conductive portion 4 is arranged so as to surround the region (center portion in FIG. 2) in the p-type layer 3 to which the p-electrode 6 is connected.

Arranging the thermally conductive portion 4 to the periphery of the connecting portion of the p-type layer 3 and the p-electrode 6, which is the heat producing portion, allows efficient release of heat generated in the p-type layer to the thermally conductive portion 4.

As shown in FIG. 2, the thermally conductive portion 4 is preferably disposed extending to the vicinity of the outer edge of the p-type layer 3. With this arrangement, a wider contact area between the thermally conductive portion 4 and the p-type layer 3 can be obtained, so that further efficient heat release can be accomplished.

In the present embodiment, the n-electrode 8 and the p-electrode 6 are disposed at opposite sides of the semiconductor stacked layer portion, and the p-electrode 6 is electrically and thermally connected with the support substrate 10.

With this arrangement, not only the heat releasing effect of the thermally conductive portion 4 but also the heat releasing path from the p-electrode 6 to the support substrate 10 can be secured, so that better heat releasing can be achieved.

Further, at the location where the p-type layer 3 and the p-electrode 6 are connected, a p-side reflector 7 made of dielectric materials is disposed to the p-electrode 6 at the side further from the p-type layer 3.

In a nitride semiconductor laser device, a superior reflector made of a nitride semiconductor, which is the material of the same system, is difficult to obtain, so that a reflector comprising a dielectric material is typically employed.

However, in this case, thermal conductivity of dielectric materials is inferior compared to that of nitride semiconductors. Thus, heat release through such a reflector is not efficient.

Even in such cases, according to the present embodiment, a thermally conductive portion 4 is directly disposed to the p-type layer 3, so that overall heat releasing property of the device can be improved and deterioration of each property can be further reduced.

Figure 3:
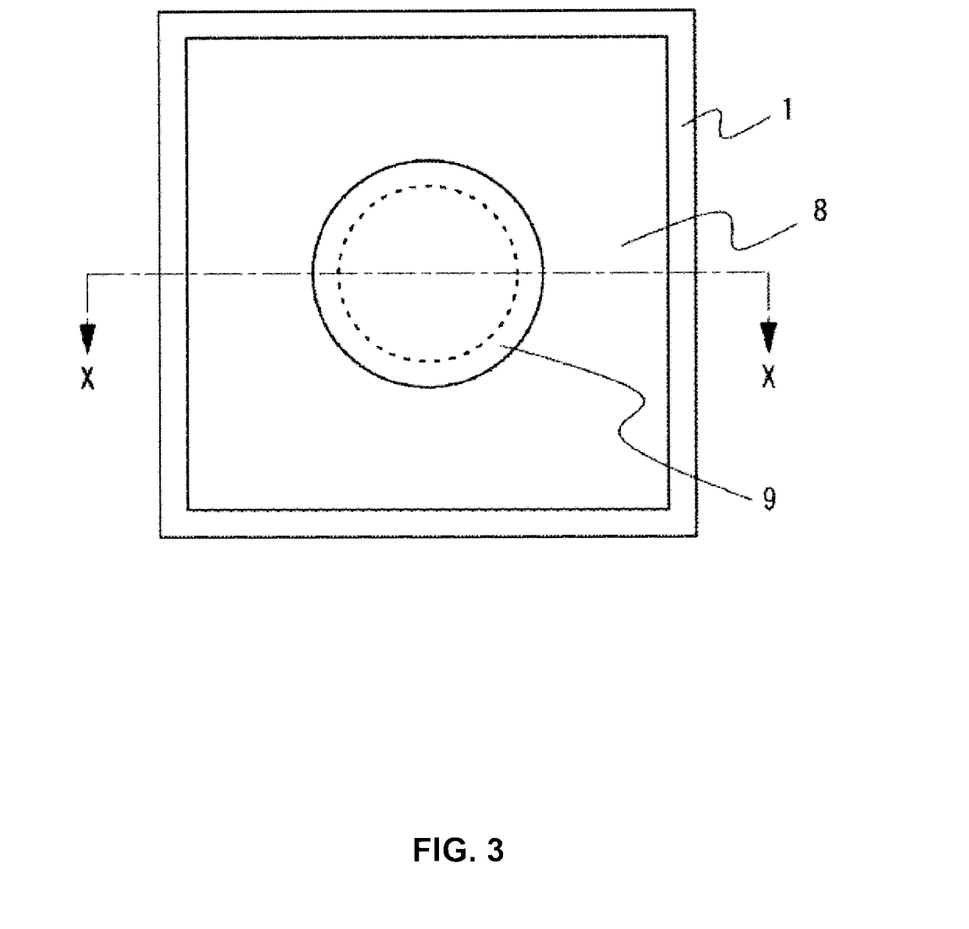
FIG. 3 is a schematic plan view illustrating a nitride semiconductor laser device shown in FIG. 1.

FIG. 3 shows a view illustrating a nitride semiconductor laser device according to the present embodiment as viewed from the n-electrode forming surface side.

A portion of the n-electrode 8 defines an opening and the n-type layer 1 is exposed from the opening.

An n-side reflector 9 is disposed at the opening of the n-electrode 8. That is, the nitride semiconductor laser device of the present embodiment is a vertical cavity surface emitting laser (VCSEL) device where a pair of reflectors are arranged in a vertical direction.

In the case of a nitride semiconductor, the n-type layer has a smaller resistivity than that of the p-type layer, so that electric current can flow in lateral direction even in the case as in the present embodiment where the n-type layer is connected to the n-electrode at a portion spaced away from the laser oscillation region. However, the p-type layer has higher resistance compared to the n-type layer, so that electric current is difficult to flow in lateral direction when it is connected to the p-electrode at a position away from the oscillation region.

Therefore, in the case where the p-electrode is disposed on the p-type layer at a position away from the laser oscillation region, current mainly flows under the p-electrode and the laser oscillation cannot occur, even if light-emission is generated.

Accordingly, in the present embodiment, at the p-side the p-type layer 3 and the p-electrode 6 are connected in the region corresponding to the laser oscillation region.

Generally, a VCSEL device has a smaller current injection region and a greater heat generation compared to that of an edge-emitting laser device.

Therefore, providing the thermally conductive portion 4 to a VCSEL device allows the thermally conductive portion 4 to efficiently release heat and thus, is preferable.

The main components of the nitride semiconductor laser device of the present embodiment will be described below.

Semiconductor Stacked Layer Portion

The semiconductor stacked layer portion contains at least the n-type layer 1 and the p-type layer 3.

The layer structure is not particularly limited, and a known layer such as a contact layer, a cladding layer, and an optical confinement layer can be included in the n-type layer 1 and the p-type layer 3.

In the present embodiment, the active layer 2 is disposed between the n-type layer 1 and the p-type layer 3.

The structure of the active layer is not particularly limited, and a known structure such as a multi quantum well structure or a single quantum well structure can be employed.

The nitride semiconductor preferably has a general formula, for example, $In_xAl_yGa_{1-x-y}N$ ($0 \leq x \leq 1$, $0 \leq y \leq 1$, and $0 \leq x+y \leq 1$).

Insulating Portion

The material of the insulating portion 5 is not limited. For example, an oxide such as $SiO_2$, $Ga_2O_3$, $Al_2O_3$, $ZrO_2$, or a nitride such as SiN, AlN and AlGaN can be used.

The thickness thereof is not specifically limited, but may be preferably 5 to 1000 nm, more preferably 10 to 300 nm.

n-Electrode

The material of the n-electrode 8 is not specifically limited. For example, the n-electrode 8 can be formed of a single layer or multilayer containing at least one of Pd, Pt, Ni, Au, Ti, W, Cu, Ag, Zn, Sn, In, Al, Ir, Rh, V, and ITO.

p-Electrode

The material of the p-electrode is not specifically limited, and preferably ZnO, $In_2O_3$, $SnO_2$, ATO, ITO, MgO, or Ni/Au, more preferably ITO can be used.

The thickness thereof is not specifically limited, and a thickness of about 5 to 100 nm can be employed.

In the present embodiment, the laser beam emitted by the active layer 2 is needed to penetrate the p-electrode 6 and is reflected by the p-side reflector 7, therefore, the p-electrode 6 is substantially transparent to the laser beam.

Thermally Conductive Portion

The material of the thermally conductive portion 4 is not limited, and a material of Ag/Ni system, Cu/TaN system, Cu/TiN system, Al/TiN system, Cu/Ti system, or Al/Ti system etc., can be used.

The thermally conductive portion 4 is not necessarily needed to be formed as a multilayer, and may be formed as a single layer.

For example, the term "Ag/Ni system" means a stacked layer in which at least Ag and Ni are stacked in this order on the p-type layer 3.

Further, the material of the thermally conductive portion 4 is not necessarily an electrically conductive material and an insulating material such as AlN may be used.

The material of the thermally conductive portion 4 preferably contains at least one of Al and Ag which has high reflectance.

With this arrangement, an optical loss at the thermally conductive portion can be suppressed, which helps facilitating laser oscillation and reduction in threshold current.

The thickness of the thermally conductive portion 4 is not limited, and for example, may be 100 to 3000 nm, preferably 500 to 2000 nm.

Reflector 7, 9

The reflector is formed of a multilayer of dielectric materials.

The dielectric material is not particularly limited. For example, a known material such as an oxide and/or nitride of Si, Mg, Al, Hf, Nb, Zr, Sc, Ta, Ga, Zn, Y, B, or Ti etc., can be used.

A dielectric multilayer film can be obtained by alternately stacking two or more material layers of above-described dielectric bodies with different refractive indices.

Specific examples thereof include multilayers such as $SiO_2/Nb_2O_5$, $SiO_2/ZrO_2$, $SiO_2/AlN$, and $Al_2O_3/Nb_2O_5$.

Support Substrate

The material of the support substrate 10 is not particularly limited, and preferably Si, GaN, AlN, or CuW, more preferably Si can be used.

The support substrate 10 is not necessarily needed to be formed as a single layer and may be formed as a multilayer.

Further, a conductive support substrate is used in the present embodiment, but the support substrate 10 does not necessarily need to have conductivity, and the support substrate 10 may be formed of an insulating material.

In the case where the support substrate 10 is formed as an insulating substrate, for example, a conductive layer is disposed between the p-electrode and the support substrate and the electric current can be supplied through the conductive layer.

Second Embodiment

Figure 4A:
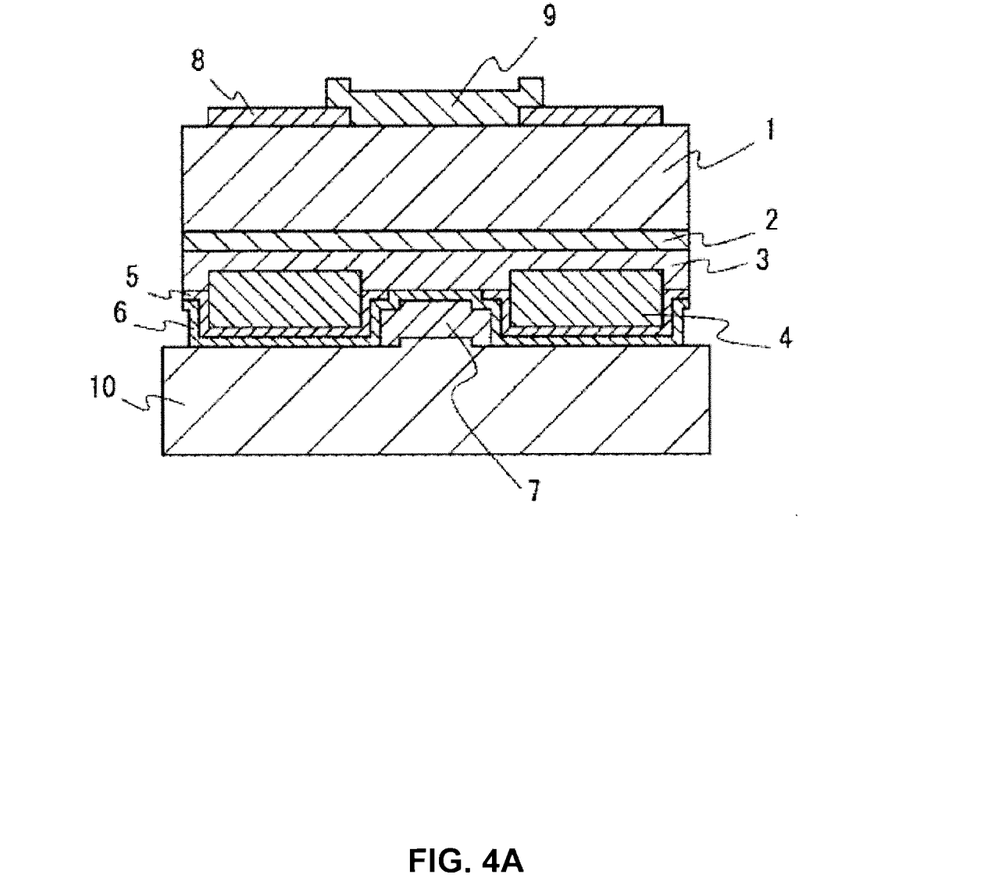
FIG. 4A is a schematic cross-sectional view illustrating a nitride semiconductor laser device according to another embodiment.

FIG. 4A shows a schematic cross sectional view illustrating a nitride semiconductor laser device according to the present embodiment.

The nitride semiconductor laser device of the present embodiment has a structure similar to the nitride semiconductor laser device of Embodiment 1 except that a part of the thermally conductive portion 4 is buried in the p-type layer 3.

In the present embodiment, the contact area between the thermally conductive portion 4 and the p-type layer 3 can be made larger than that in the first Embodiment, so that much greater heat releasing can be obtained.

Third Embodiment

Figure 4B:
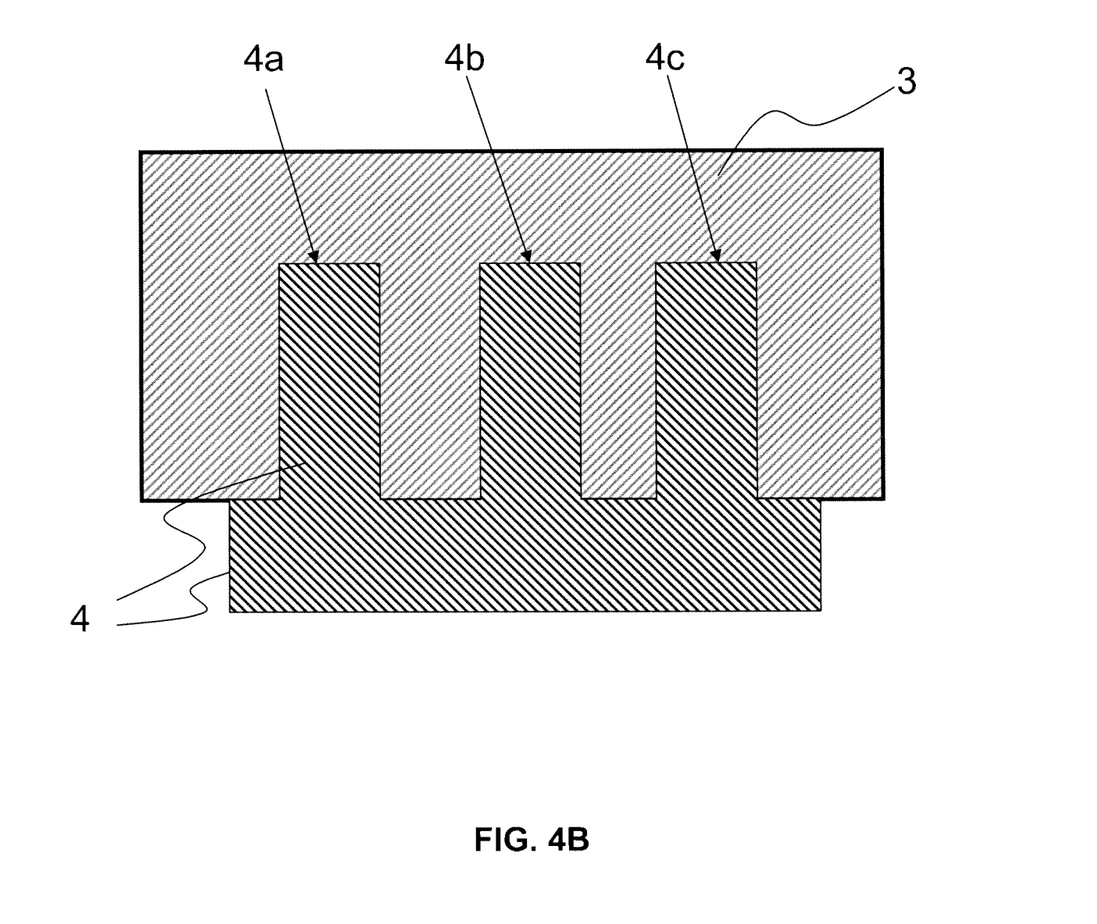
FIG. 4B is a schematic cross-sectional view illustrating a nitride semiconductor laser device having a thermally conductive portion forming a plurality of protrusions in the p-type layer.

FIG. 4B shows a schematic cross-sectional view illustrating a nitride semiconductor laser device according to the third embodiment.

The thermally conductive portion 4 forms a plurality of protrusions 4a, 4b, 4c, . . . , which are buried in the p-type layer 3.

The contact area between the thermally conductive portion 4 and the p-type layer 3 are increased, thereby further improving the releasing of the heat generated in the p-type layer 3 into the thermally conductive portion 4.

In some embodiments, a thermally conductive portion may also be included in the n-type layer or included in the n-type layer alone, even though in most cases the issue of heating is less severe compared with the p-type layer.

In some embodiments, an optical apparatus is provided, which depends for its function on a nitride semiconductor laser. The optical apparatus can be, for example, optical disc devices, display devices including televisions, monitors and large-scale displays such as for sports arenas and advertising, laser printers, and devices using phosphor diodes such as medical lighting.

Nitride semiconductor materials may be more difficult to process compared with other compound semiconductors. In some embodiments, a method of manufacturing a nitride semiconductor laser device is provided to form the structures of the thermally conductive portion. The method includes: forming a stack including an n-type layer and a p-type layer each comprising a nitride semiconductor; forming an n-electrode electrically coupled to the n-type layer; forming a p-electrode electrically coupled to the p-type layer; and forming a thermally conductive portion in contact with the p-type layer in a region which is different from the region where the p-electrode is connected, wherein the thermally conductive portion is electrically insulated from the p-electrode.

Although the foregoing refers to particular preferred embodiments, it will be understood that the disclosure is not so limited. Various modifications may be made to the disclosed embodiments and that such modifications are intended to be within the scope of the disclosure. All of the publications, patent applications and patents cited herein are incorporated herein by reference in their entireties.

What is claimed is:

1. A nitride semiconductor laser device comprising:
   a stack including an n-type layer, an active layer, and a p-type layer, each comprising a nitride semiconductor, the active layer being disposed between the n-type layer and the p-type layer;
   an n-electrode electrically coupled to the n-type layer;
   a p-electrode electrically coupled to the p-type layer;
   a thermally conductive portion disposed in contact with the p-type layer in a region which is different from the region where the p-electrode is connected; and
   an insulating portion disposed between the thermally conductive portion and the p-electrode.

2. The nitride semiconductor laser device of claim 1, wherein the thermally conductive portion surrounds a region of the p-type layer to which the p-electrode is connected.

3. The nitride semiconductor laser device of claim 1, wherein at least a part of the thermally conductive portion is buried in the p-type layer.

4. The nitride semiconductor laser device of claim 3, wherein the thermally conductive portion forms a plurality of protrusions in the p-type layer.

5. The nitride semiconductor laser device of claim 1, wherein the n-electrode and the p-electrode are disposed at opposite sides of the stack, and the p-electrode is electrically and thermally connected to a support substrate.

6. The nitride semiconductor laser device of claim 1, wherein a p-side reflector comprising dielectric materials is disposed to the p-electrode at a portion where the p-type layer and the p-electrode are connected and at the side distal from the p-type layer.

7. The nitride semiconductor laser device of claim 1, wherein the thermally-conductive portion comprises at least one of a Ag/Ni stack, a Cu/TaN stack, a Cu/TiN stack, an Al/TiN stack, a Cu/Ti stack, an Al/Ti stack, or an AlN layer.

8. The nitride semiconductor laser device of claim 1, wherein the thermally conductive portion is reflective.

9. The nitride semiconductor laser device of claim 1, wherein the thermally conductive portion comprises an electrically conductive material.

10. The nitride semiconductor laser device of claim 1, wherein the thermally conductive portion is disposed in contact with the p-type layer in a region which is different from the region where the p-electrode is electrically coupled to the p-type layer.

11. A method of manufacturing a semiconductor laser device, the method comprising:

forming a stack including an n-type layer, an active layer, and a p-type layer, each comprising a nitride semiconductor, the active layer being formed between the n-type layer and the p-type layer;

forming a thermally conductive portion in contact with the p-type layer;

forming an insulating portion in contact with the thermally conductive portion and the p-type layer;

forming a p-electrode electrically coupled to the p-type layer in a region which is different from the region where the thermally conductive portion is connected; and forming an n-electrode electrically coupled to the n-type layer, wherein the insulating portion is disposed between the thermally conductive portion and the p-electrode.

12. The method of claim 11, wherein said forming a thermally conductive portion comprises forming the thermally conductive portion to be able to surround a region of the p-type layer which region is for connection to the p-electrode.

13. The method of claim 11, wherein after formation of the p-type layer, at least a part of the thermally conductive portion is buried in the p-type layer.

14. The method of claim 11, wherein after formation of the p-type layer, the thermally conductive portion forms a plurality of protrusions in the p-type layer.

15. The method of claim 11, wherein the thermally conductive portion comprises an electrically conductive material.

16. The method of claim 11, wherein the p-electrode is electrically coupled to the p-type layer in a region which is different from the region where the thermally conductive portion is in contact with the p-type layer.

17. An optical apparatus including a nitride semiconductor laser device, wherein the nitride semiconductor laser device comprises:

a stack including an n-type layer, an active layer, and a p-type layer, each comprising a nitride semiconductor, the active layer being disposed between the n-type layer and the p-type layer;

an n-electrode electrically coupled to the n-type layer;

a p-electrode electrically coupled to the p-type layer;

a thermally conductive portion disposed in contact with the p-type layer in a region which is different from the region where the p-electrode is connected; and an insulating portion disposed between the thermally conductive portion and the p-electrode wherein the nitride semiconductor laser device forms an operable portion of the optical apparatus.

18. The optical apparatus of claim 17, wherein the thermally conductive portion surrounds a region of the p-type layer to which the p-electrode is connected.

19. The optical apparatus of claim 17, wherein at least a part of the thermally conductive portion is buried in the p-type layer.

20. The optical apparatus of claim 19, wherein the thermally conductive portion forms a plurality of protrusions in the p-type layer.

21. The optical apparatus of claim 17, wherein the n-electrode and the p-electrode are disposed at opposite sides of the stack, and the p-electrode is electrically and thermally connected to a support substrate.

22. The optical apparatus of claim 17, wherein a p-side reflector comprising dielectric materials is disposed to the p-electrode at a portion where the p-type layer and the p-electrode are connected and at the side distal from the p-type layer.

23. The optical apparatus of claim 17, wherein the thermally-conductive portion comprises at least one of a Ag/Ni stack, a Cu/TaN stack, a Cu/TiN stack, an Al/TiN stack, a Cu/Ti stack, an Al/Ti stack, or an AlN layer.

24. The optical apparatus of claim 17, wherein the thermally conductive portion is reflective.

25. The optical apparatus of claim 17, wherein the thermally conductive portion comprises an electrically conductive material.

26. The optical apparatus of claim 17, wherein the thermally conductive portion is disposed in contact with the p-type layer in a region which is different from the region where the p-electrode is electrically coupled to the p-type layer.

27. A nitride semiconductor laser device comprising:

a stack including an n-type layer, and active layer, and a p-type layer, each comprising a nitride semiconductor, the active layer being disposed between the n-type layer and the p-type layer;

an n-electrode electrically coupled to the n-type layer;

a p-electrode electrically coupled to the p-type layer;

a thermally conductive portion disposed in contact with at least one of the p-type layer and the n-type layer in a region which is different from the region where the respective p-electrode or the n-electrode is connected; and an insulating portion disposed between the thermally conductive portion and the p-electrode or between the thermally conductive portion and the n-electrode.

28. The nitride semiconductor laser device of claim 27, wherein the thermally conductive portion comprises an electrically conductive material.

29. The nitride semiconductor laser device of claim 27, wherein the thermally conductive portion is disposed in contact with the at least one of the p-type layer and the n-type layer in a region which is different from the region where the respective p-electrode or the n-electrode is electrically coupled to the respective p-type layer or n-type layer.

* * * * *